US010825700B2

(12) United States Patent
Ishiguro et al.

(10) Patent No.: US 10,825,700 B2
(45) Date of Patent: Nov. 3, 2020

(54) PLASMA PROCESSING APPARATUS AND METHOD FOR RELEASING SAMPLE

(71) Applicant: Hitachi High-Technologies Corporation, Tokyo (JP)

(72) Inventors: Masaki Ishiguro, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 493 days.

(21) Appl. No.: 15/425,155

(22) Filed: Feb. 6, 2017

(65) Prior Publication Data
US 2018/0040491 A1 Feb. 8, 2018

(30) Foreign Application Priority Data

Aug. 3, 2016 (JP) ................................. 2016-152424

(51) Int. Cl.
H01L 21/67 (2006.01)
H01J 37/32 (2006.01)
H01L 21/683 (2006.01)

(52) U.S. Cl.
CPC .. *H01L 21/67069* (2013.01); *H01J 37/32082* (2013.01); *H01J 37/3299* (2013.01);
(Continued)

(58) Field of Classification Search
USPC ................ 156/345.51–345.55; 118/728–730; 361/234
See application file for complete search history.

(56) References Cited

U.S. PATENT DOCUMENTS 6,628,500 B1 * 9/2003 Thomas .............. H01L 21/6833
361/230
2008/0242086 A1 10/2008 Matsumaru et al.
(Continued)

FOREIGN PATENT DOCUMENTS

JP 11-111826 A 4/1999
JP 2004-047511 A 2/2004
(Continued)

OTHER PUBLICATIONS

English Machine Translation JP2004047511_Iwanna et al (Year: 2004).*
(Continued)

*Primary Examiner* — Rakesh K Dhingra
(74) *Attorney, Agent, or Firm* — Mattingly & Malur, PC

(57) ABSTRACT

The invention provides a plasma processing apparatus which includes a processing chamber, a radio frequency power source to supply a radio frequency power for plasma generation, a sample stage equipped with an electrostatic chuck electrode of a sample, a DC power source to apply a DC voltage to the electrode, and a control unit to change the DC voltage from a predetermined value to almost 0 V when a predetermined time elapses since the supplying of the radio frequency power is stopped. The predetermined value is a predetermined value indicating that a potential of the sample when the DC voltage is almost 0 V becomes almost 0 V. The predetermined time is a time defined on the basis of a time when charged particles generated by the plasma processing disappear or a time when an afterglow discharge disappears.

5 Claims, 6 Drawing Sheets

(52) U.S. Cl.
CPC .. *H01J 37/32532* (2013.01); *H01J 37/32577* (2013.01); *H01J 37/32715* (2013.01); *H01J 37/32935* (2013.01); *H01L 21/6833* (2013.01); *H01J 2237/334* (2013.01)

(56) References Cited

U.S. PATENT DOCUMENTS

| | | | |
|---|---|---|---|
| 2010/0008015 A1* | 1/2010 | Booth | H01L 21/6833 361/234 |
| 2015/0303092 A1 | 10/2015 | Kawabata | |
| 2016/0027615 A1 | 1/2016 | Ishiguro et al. | |

FOREIGN PATENT DOCUMENTS

| | | | |
|---|---|---|---|
| JP | 2004047511 | * | 2/2004 |
| JP | 2007-73568 A | | 3/2007 |
| JP | 2008-251676 A | | 10/2008 |
| JP | 2015-72825 A | | 4/2015 |
| JP | 2016-32096 A | | 3/2016 |
| KR | 10-1998-024679 A | | 7/1998 |
| KR | 10-2015-0053899 A | | 5/2015 |
| TW | 201349339 A | | 12/2013 |

OTHER PUBLICATIONS

Japanese Office Action received in corresponding Japanese Application No. 2016-152424 dated Jun. 25, 2019.
Taiwanese Office Action received in corresponding Taiwanese Application No. 106102962 dated Jun. 4, 2018.
Korean Office Action received in corresponding Korean Application No. 10-2017-0004058 dated Jan. 17, 2018.

* cited by examiner

PRIOR ART

PLASMA PROCESSING APPARATUS AND METHOD FOR RELEASING SAMPLE

CLAIM OF PRIORITY

The present application claims priority from Japanese patent application JP 2016-152424 filed on Aug. 3, 2016, the content of which is hereby incorporated by reference into this application.

BACKGROUND OF THE INVENTION

1. Field of the Invention

The present invention relates to a plasma processing apparatus and a method for releasing a sample from a sample stage.

2. Description of the Related Art

As one of plasma processing methods of manufacturing a semiconductor, there is a plasma etching. In the plasma etching, a sample (wafer) is placed on a sample stage in a processing chamber, and exposed to plasma. At this time, a specific stacked film is selectively removed from the wafer by adjusting various processing conditions such as a gas chemistry to be introduced into the processing chamber and a radio frequency power to be applied to the wafer, so that a fine circuit pattern is formed on the wafer.

In such a plasma etching, there is a need to prevent a wafer deviation during the processing and to adjust a wafer temperature. Therefore, the wafer is electrostatically adsorbed onto the sample stage typically using an electrostatic chuck electrode. The electrostatic adsorption of the wafer is released after the plasma etching ends. The wafer is released from the sample stage using a releasing mechanism which pushes up the wafer upward the sample stage, and then carried out of the processing chamber.

In the wafer adsorption using the electrostatic chuck electrode, the wafer is adsorbed by an electrostatic force generated in a dielectric film between the electrode and the wafer by applying a voltage to an electrode. Therefore, the adsorption can be released by turning off the voltage applied to the electrostatic chuck electrode. However, at this time, if the dielectric film and the wafer are insufficiently neutralized, charges are left. Therefore, an adsorption force may be applied onto the wafer even after the voltage applied to the electrode is turned off.

Since such a residual adsorption force is generated, a position of the wafer may be deviated when the wafer is released from the sample stage, or the wafer may be damaged by a force applied to the wafer when being released. The wafer deviation may lead to a transport error when the wafer is carried out. In some cases, a process of manufacturing products may be stopped. The damage of the wafer causes a loss in the wafer itself, and also requires a time for removing the damaged wafer from an apparatus to recover the apparatus. Either case has a strong possibility to cause an adverse influence on productivity of the process of manufacturing the wafers. Therefore, the residual adsorption force caused by the neutralization is necessarily lowered in order to reduce the above risks. In addition, as a neutralization method for reducing the residual adsorption force, the following methods have been known so far.

JP 2004-47511 A discloses a neutralization processing method for releasing, from a dielectric body, an adsorbed object which is placed on the dielectric body equipped with an electrode and adsorbed to the dielectric body by an electrostatic force generated when a predetermined polarity of DC voltage is applied to the electrode. The method includes stopping the DC voltage from being applied to the electrode, exposing plasma for neutralizing the adsorbed object, and applying the electrode with a DC voltage having the same polarity as that of a self-bias voltage which is generated in the adsorbed object by the exposure of the plasma.

SUMMARY OF THE INVENTION

JP 2004-47511 A describes stopping of the voltage application to the electrostatic chuck electrode and stopping of the voltage application simultaneously with stopping of the applying of the radio frequency voltage for generating the plasma. However, at the time when the plasma processing ends, the charged particles in the plasma are left in a space even after the incident power of the radio frequency power for generating the plasma is stopped. As described in a neutralization method disclosed in JP 2004-47511 A, when the voltage applied to the electrostatic chuck electrode is set to 0 V at the same time when the plasma processing ends, the wafer has a potential by the residual charged particles. A potential difference is caused again between the wafer and the electrode, and thus there is a concern that the residual adsorption force is generated.

In particular, in the case that the resistance value of the dielectric film between the wafer and the electrostatic chuck electrode is sufficiently large, residual adsorption tends to remain for a long time. In other words, since the current flowing between the wafer and the electrode with high resistive dielectric film, such as Coulomb type electrostatic chuck electrode, is significantly small, the residual adsorption force generated as described above is not released for a long time.

Therefore, in order to avoid the above problems, the stopping of the voltage application to the electrostatic chuck electrode may be performed after the stopping of the application of the radio frequency voltage for generating the plasma. However, JP 2004-47511 A fails to describe about a relation of a relative order between a timing of stopping the voltage application to the electrostatic chuck electrode and a timing of stopping the radio frequency voltage for generating the plasma.

Therefore, it can be said that JP 2004-47511 A has no consideration about that the wafer is charged again by the charged particles left in a vacuum processing chamber when the neutralization plasma processing ends after the neutralization, and thus the residual adsorption force is generated by the charging.

The invention provides a plasma processing apparatus which can perform a neutralization processing in consideration of recharging of a wafer caused by the residual charged particles in the processing chamber after a radio frequency power for generating the plasma is stopped, and a method for releasing a sample from a sample stage in the neutralization processing.

The invention provides a plasma processing apparatus which includes a processing chamber in which a sample is subjected to a plasma processing, a radio frequency power source which supplies a radio frequency power to generate plasma, a sample stage which includes an electrode to electrostatically adsorb the sample and is used to place the sample, a DC power source which applies a DC voltage to the electrode, and a controller which changes the DC voltage from a predetermined value to almost 0 V when a predetermined time elapses since the supplying of the radio frequency power is stopped. The predetermined value is a predetermined value indicating that a potential of the sample when the DC voltage is almost 0 V becomes almost 0 V. The predetermined time is a time defined on the basis of a time when charged particles generated by the plasma processing disappear or a time when an afterglow discharge disappears.

In addition, the invention provides a method for releasing a sample from a sample stage, in which the sample is released from the sample stage where the sample is electrostatically adsorbed. In the method, a DC voltage applied to an electrode for electrostatically adsorbing the sample to the sample stage is changed from a predetermined value to almost 0 V after a predetermined time elapses since supplying a radio frequency power to generate plasma is stopped. The predetermined value is a predetermined value indicating that a potential of the sample when the DC voltage is almost 0 V becomes almost 0 V. The predetermined time is a time defined on the basis of a time when charged particles generated by the plasma processing disappear or a time when an afterglow discharge disappears.

According to the invention, it is possible to perform a neutralization processing in consideration of recharging of a wafer caused by the residual charged particles in a processing chamber after a radio frequency power for generating the plasma is stopped.

DESCRIPTION OF THE PREFERRED EMBODIMENTS

Figure 1:
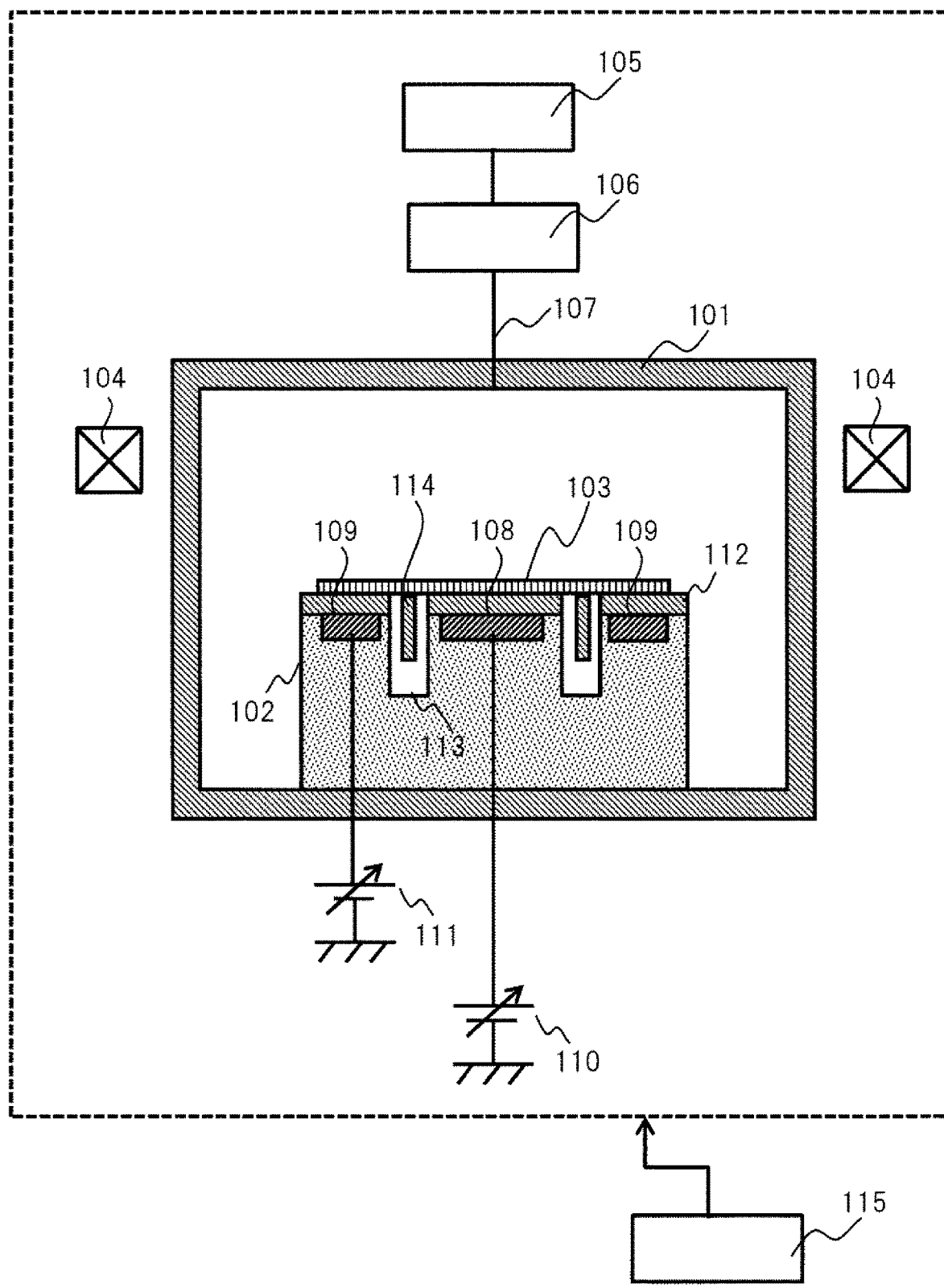
FIG. 1 is a diagram schematically illustrating a configuration of a vertical cross section of a plasma processing apparatus according to the invention.

FIG. 1 illustrates a schematic configuration of a vertical cross section of a plasma processing apparatus in this embodiment. The plasma processing apparatus of FIG. 1 is a plasma etching apparatus of an electron cyclotron resonance (ECR) type. Hereinafter, the electron cyclotron resonance will be referred to as ECR.

The plasma processing apparatus which is the ECR-type plasma etching apparatus of FIG. 1 performs an etching processing on a sample by generating plasma in a processing chamber 101 where a wafer (sample) 103 is placed on a sample stage (a placing stage of a sample) 102 disposed in the processing chamber (vacuum processing chamber) 101.

The plasma processing apparatus includes solenoid coils 104 which generate a static magnetic field in the processing chamber 101, a microwave power source 105 which is a radio frequency power source, a microwave oscillation source 106 (magnetron), a waveguide 107, and a controller 115 which controls the etching processing. A magnetic field is formed in the processing chamber 101 by the solenoid coils 104. The microwave oscillated by the microwave oscillation source 106 caused by the radio frequency power from the microwave power source 105 is introduced to the processing chamber 101 through the waveguide 107. The microwave gives energy to the electrons by the ECR in the magnetic field formed by the solenoid coils 104. The electrons ionize gases supplied from gas supply sources (not illustrated) to generate plasma.

A cooling gas is supplied to the backside of the wafer 103 to adjust the temperature of the wafer 103 during the plasma processing. The wafer 103 is electrostatically adsorbed onto the sample stage 102 by dipole electrostatic chuck electrodes 108 and 109 in order to prevent the wafer 103 from being deviated due to the cooling gas. Herein, the dipole electrostatic chuck electrodes are electrostatic chuck electrodes which electrostatically adsorb the wafer 103 onto the sample stage 102 by DC voltages applied to two electrodes. The electrostatic chuck electrodes 108 and 109 of this embodiment are configured such that the electrostatic chuck electrode (one electrode) 108 is disposed inside on a concentric circle, and the electrostatic chuck electrode 109 (the other electrode) is disposed outside.

As illustrated in FIG. 1, variable DC power sources 110 and 111 (independent power sources) are respectively connected to the electrostatic chuck electrodes 108 and 109. The variable DC power source 110 is connected to the inside electrostatic chuck electrode 108, and the variable DC power source 111 is connected to the outside electrostatic chuck electrode 109. A dielectric layer 112 is disposed between the electrostatic chuck electrodes 108 and 109 and the wafer 103. Further, the electrostatic chuck electrodes 108 and 109 and the wafer 103 are electrically connected with a finite resistance value and a finite electrostatic capacitance. In this embodiment, it is assumed that the resistance value of the dielectric layer is very large, and the wafer and the electrostatic chuck electrode are electrically connected only through the electrostatic capacitance.

In addition, a reverse-polarity voltage is applied to each of the electrostatic chuck electrodes 108 and 109 by the variable DC power sources when the wafer is adsorbed onto the sample stage. For example, a voltage of +500 V is applied to the inside electrostatic chuck electrode 108 by the variable DC power source 110, and a voltage of −500 V is applied to the outside electrostatic chuck electrode 109 by the variable DC power source 111. However, in a case where there is no need to adsorb the wafer, the same-polarity voltage may be applied to the electrostatic chuck electrodes 108 and 109.

When the same-polarity voltage is applied as described above, the potential of the wafer can be controlled without performing the adsorption in a case where the plasma discharge is not performed. For example, the potential of the wafer can be made to have a positive polarity by applying a voltage of +500 V to the inside electrostatic chuck electrode 108 by the variable DC power source 110 and by applying a voltage of +500 V to the outside electrostatic chuck electrode 109 by the variable DC power source 111.

The plasma processing apparatus includes passage holes 113 which are formed to pass through the sample stage, and pushing-up pins 114 which are disposed in the passage holes to be vertically movable, as a mechanism for releasing the wafer from the sample stage 102 after the etching processing ends and the electrostatic adsorption is released. After the electrostatic adsorption is released, the wafer is released from the sample stage 102 by pushing up the wafer toward the upper side of the sample stage 102 using the pushing-up pins 114 which are a set of releasing mechanism. Then, the wafer raised by the pushing-up pins is carried out of the processing chamber using a conveying mechanism (not illustrated).

Next, the problems in a potential difference between the electrostatic chuck electrode and the wafer at the time of the conventional neutralization processing, and the process thereof will be described using a timing chart of a neutralization processing in the conventional processing methods illustrated in FIG. 2. Herein, the neutralization is a process of releasing the electrostatically adsorbed wafer from the sample stage in order to carry the wafer 103 electrostatically adsorbed on the sample stage 102 from the processing chamber 101 after the plasma processing (plasma etching) ends. Further, the description in the conventional processing method illustrated in FIG. 2 will be given using a monopole electrostatic chuck electrode.

Figure 2:
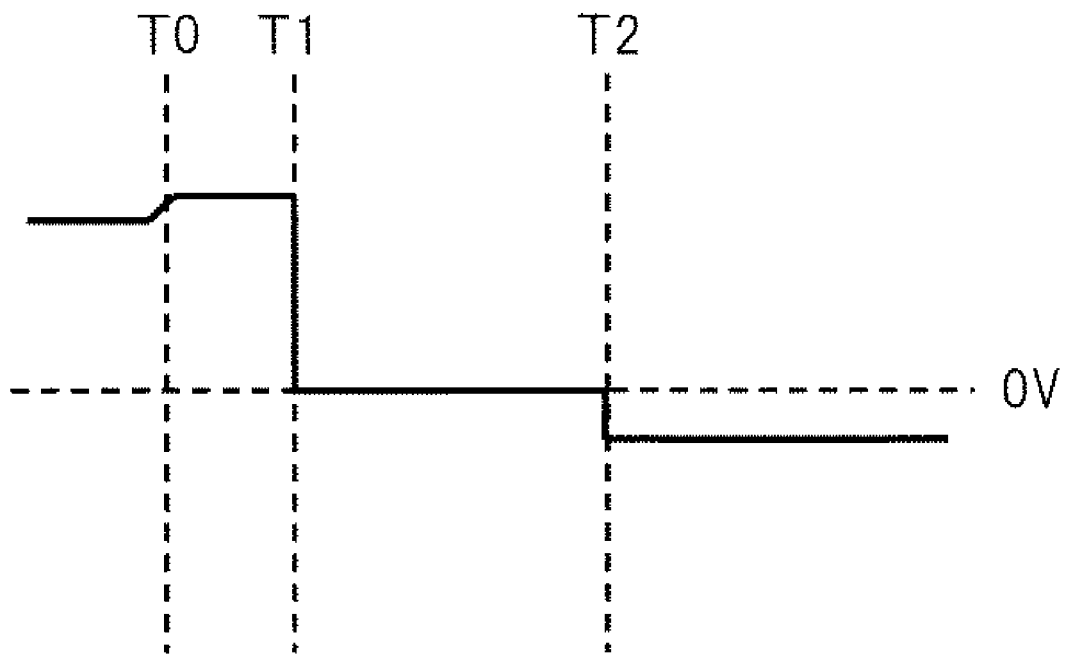
FIG. 2 is a diagram illustrating a potential difference between an electrostatic chuck electrode and a wafer of a conventional neutralization processing.

First, a microwave incident power is changed to generate the plasma for the neutralization after the etching processing ends at T0 of FIG. 2. The changed microwave incident power is 400 W for example. At this time, the gas is desirably switched to generate the plasma for neutralization at the same time. The plasma for neutralization is typically generated using an inert gas (for example, Ar and He). Next, a voltage applied to the electrostatic chuck electrode at any time T1 during the plasma for neutralization is being generated is a voltage to cause the equal wafer potential in neutralization plasma using the variable DC power source.

In addition, in a case where a dielectric film between the wafer and the electrostatic chuck electrode has a sufficiently large resistance value, the current rarely flows between the wafer and the electrostatic chuck electrode, so that the potential of the wafer is determined not by the potential variation of the electrostatic chuck electrode but only by the plasma state. Therefore, even when the potential is applied by the variable DC power source as described above, the potential of the wafer does not vary but equal to the potential of the electrostatic chuck electrode at time T1. In this way, the potential difference between the wafer and the electrostatic chuck electrode disappears, so that an electrostatic force working between the wafer and the electrostatic chuck electrode becomes small quickly.

Thereafter, the microwave power for generating the plasma is turned off when the voltage applied to the electrostatic chuck electrode becomes 0 V. However, when the microwave power is turned off, the plasma does not instantaneously disappear, but the charged particles in a plasma state are left in the vacuum processing chamber even in a very short time period. This phenomenon is an afterglow discharge after the microwave power is turned off.

In a state where the charged particles are left in the vacuum processing chamber, the potential of the wafer is determined by the charged particles remaining in the vacuum processing chamber, the potential is generated in the wafer even when the voltage applied to the electrostatic chuck electrode becomes 0 V at time T2, and a potential difference is caused again between the wafer and the electrostatic chuck electrode at time T2 as illustrated in FIG. 2. An adsorption force caused by the potential difference is held for a long time in a case where the resistance of the dielectric film is large, and causes a wafer deviation or a wafer damage when the wafer is released from the sample stage by the pushing-up pins.

Figure 3A:
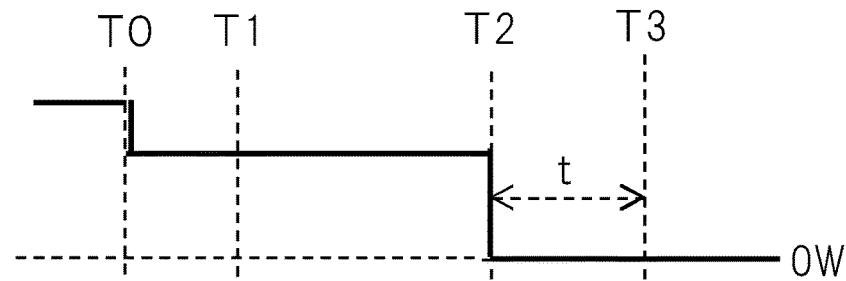
FIGS. 3A to 3D are a timing chart illustrating a neutralization processing according to the invention.
Figure 3B:
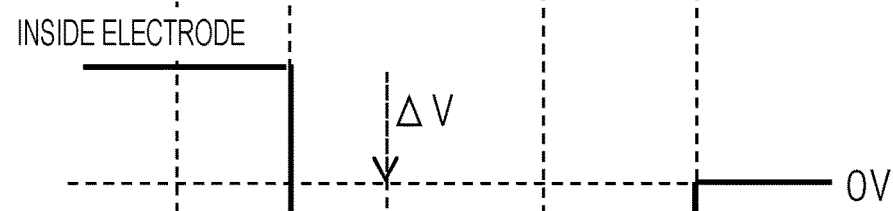
Figure 3C:
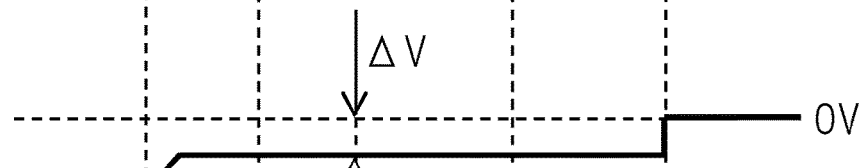
Figure 3D:
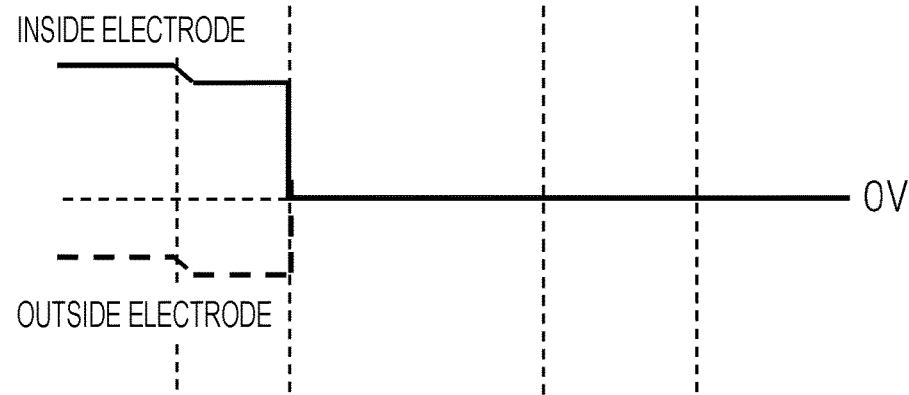

A method for releasing the wafer from the wafer stage according to the invention to solve the above problem will be described using a timing chart illustrated in FIGS. 3A to 3D. FIG. 3A illustrates the incident power of the microwave, FIG. 3B illustrates the potential of the electrostatic chuck electrodes, FIG. 3C illustrates the potential of the wafer, and FIG. 3D illustrates the potential difference between the electrostatic chuck electrodes and the wafer. First, similarly to the conventional method for releasing the wafer, the neutralization plasma is generated at time T0 also in the invention, and the potentials of the inside electrostatic chuck electrode 108 and the outside electrostatic chuck electrode 109 at any time T1 during the neutralization plasma is generated are set to $-\Delta V$ with variable DC power sources. Further, the neutralization plasma is generated using an inert gas, and the neutralization in the invention may be performed using the same plasma as that used at the time of the plasma processing (plasma etching) performed before the neutralization.

At this time, the potential difference between the wafer and the electrode becomes "0" at time T1 as illustrated in FIG. 3D. Therefore, the electrostatic adsorption force working between the wafer and the electrode disappears. Therefore, the radio frequency power (microwave incident power) to generate the plasma for neutralization is blocked at time T2 in the invention. The charged particles left in the vacuum processing chamber disappear completely at time T3 elapsed by a predetermined time t after the radio frequency power is blocked. The potential of the wafer at that time is kept as it is during the plasma discharge if the resistance value of the dielectric film is sufficiently large as illustrated in FIG. 3C. Herein, the predetermined time t has been set to a time when the charged particles left in the vacuum processing chamber disappear, and may be set to a time taken until the afterglow discharge of the plasma for neutralization disappears.

Figure 4:
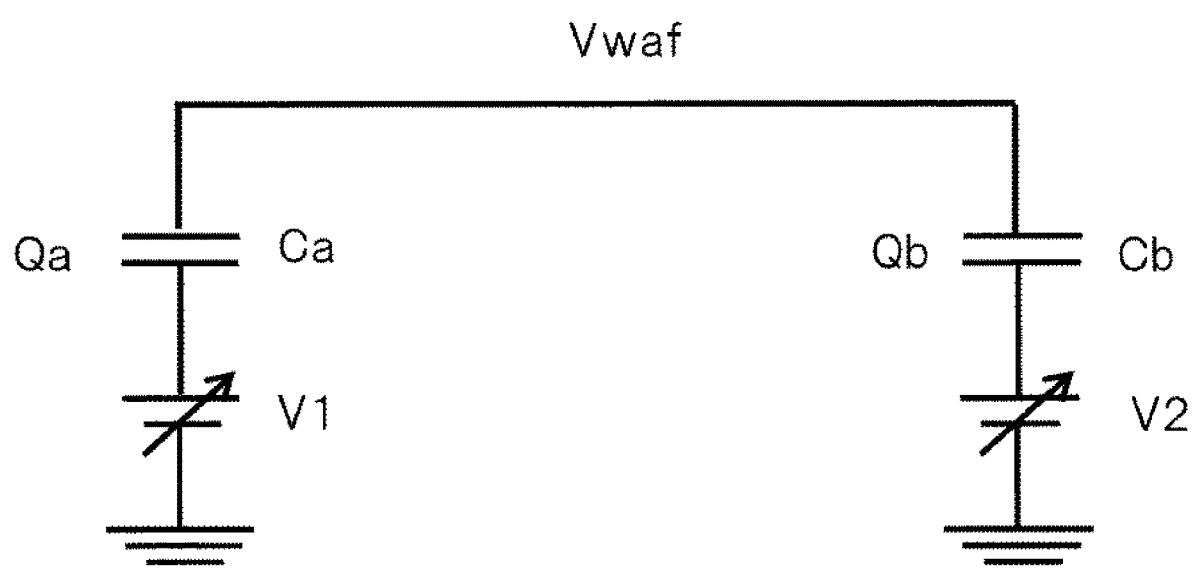
FIG. 4 is a diagram illustrating an equivalent circuit obtained by modeling variable DC power sources, electrostatic chuck electrodes, a dielectric layer, and the wafer.

In addition, since also the potentials of the electrostatic chuck electrodes do not vary as illustrated in FIG. 3B, the potential difference between the wafer and the electrostatic chuck electrodes is kept to "0" as illustrated in FIG. 3D. There is no electrostatic adsorption force between the wafer and the electrode. Next, the DC voltages are set to 0 V which is applied to the electrostatic chuck electrodes at time T3 after the charged particles in the vacuum processing chamber disappear completely. At this time, the potentials of the electrostatic chuck electrodes vary, and the potential of the wafer also varies by the same amount as that of the potential of the electrostatic chuck electrodes at almost the same time when the potentials of the electrostatic chuck electrode vary. Such a change will be described using a simplified equivalent circuit of the electric circuit which includes the wafer after the plasma disappears, the electrostatic chuck electrodes, the dielectric layer, and the variable DC power sources as illustrated in FIG. 4. Further, in the equivalent circuit of FIG. 4, the resistance value of the dielectric film between the wafer and the electrostatic chuck electrodes is assumed to be sufficiently large, and only the electrostatic capacitance will be considered.

Ca and Cb of FIG. 4 are the electrostatic capacitance values of the dielectric layer, Qa and Qb are charges accumulated in the electrostatic capacitance, and V1 and V2 are voltage values of the variable DC power sources. In addition, when the wafer potential is set to Vwaf, the following Equation 1 is satisfied in the equivalent circuit illustrated in FIG. 4.

[Expression 1]

$$V_{waf} = V_1 + \frac{Q_a}{C_a}$$

$$V_1 + \frac{Q_a}{C_a} = V_2 + \frac{Q_b}{C_b}$$

Equation 1

Further, since Qa=−Qb in this case, the wafer potential becomes the following Equation 2 on an assumption of Qa=−Qb=Q.

[Expression 2]

$$V_{waf} = V_1 + \frac{C_b}{C_a + C_b}(V_2 - V_1) \quad \text{Equation 2}$$

Herein, when Ca=Cb, the wafer potential becomes the following Equation 3.

[Expression 3]

$$V_{waf} = \frac{V_1 + V_2}{2} \quad \text{Equation 3}$$

Therefore, when the potential of the electrostatic chuck electrode varies to make V1 become V1+ΔV1 and V2 become V2+ΔV2, a variation amount ΔVwaf of the wafer potential is obtained as the following Equation 4.

[Expression 4]

$$\Delta V_{waf} = \frac{\Delta V_1 + \Delta V_2}{2} \quad \text{Equation 4}$$

Therefore, when an average value of the potential of the inside electrostatic chuck electrode 108 and the potential of the outside electrostatic chuck electrode 109 is shifted by ΔV, the wafer potential is also shifted by ΔV. In addition, in a case where only the capacitance is dominant, the variation of the wafer potential occurs immediately after the changes of electrostatic chuck electrodes potentials.

As described above, since the potentials of the electrostatic chuck electrodes and the potential of the wafer vary by the same amount at the same timing at time T3, the potential difference between the wafer and the electrostatic chuck electrodes is kept to be "0" at time T3 as illustrated in FIG. 3D. In other words, the potential of the electrostatic chuck electrodes can be set to 0 V in a state where the electrostatic adsorption force working between the wafer and the electrostatic chuck electrode is set to "0". As described above, after the potentials of the electrostatic chuck electrodes are set to 0 V, the wafer is released from the sample stage by the pushing-up pins, and carried to the outside of the processing chamber by a carrying mechanism (not illustrated).

Figure 5A:
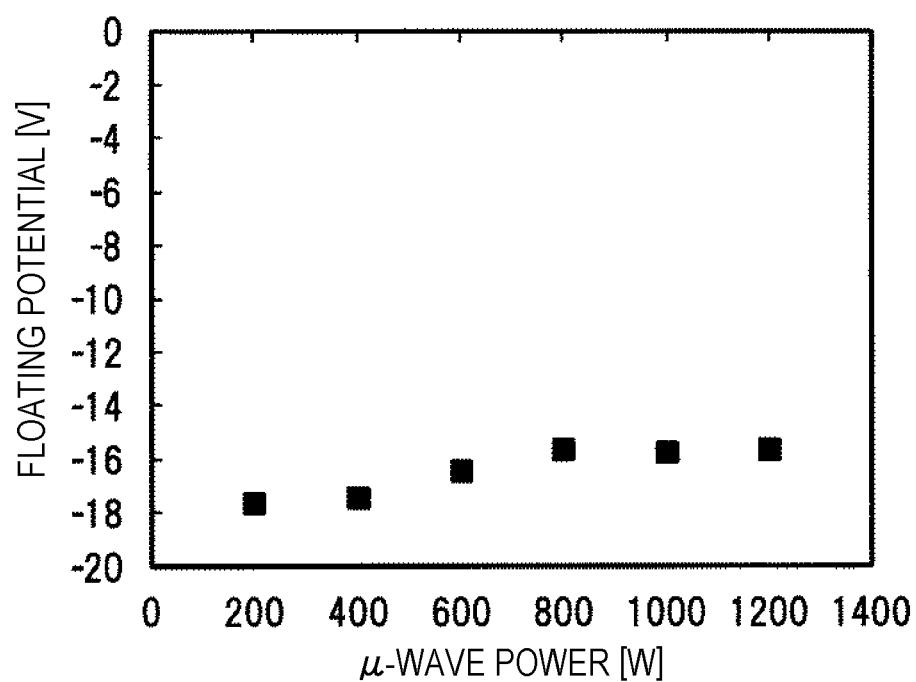
FIGS. 5A and 5B are graphs illustrating a measurement result of a floating potential.
Figure 5B:
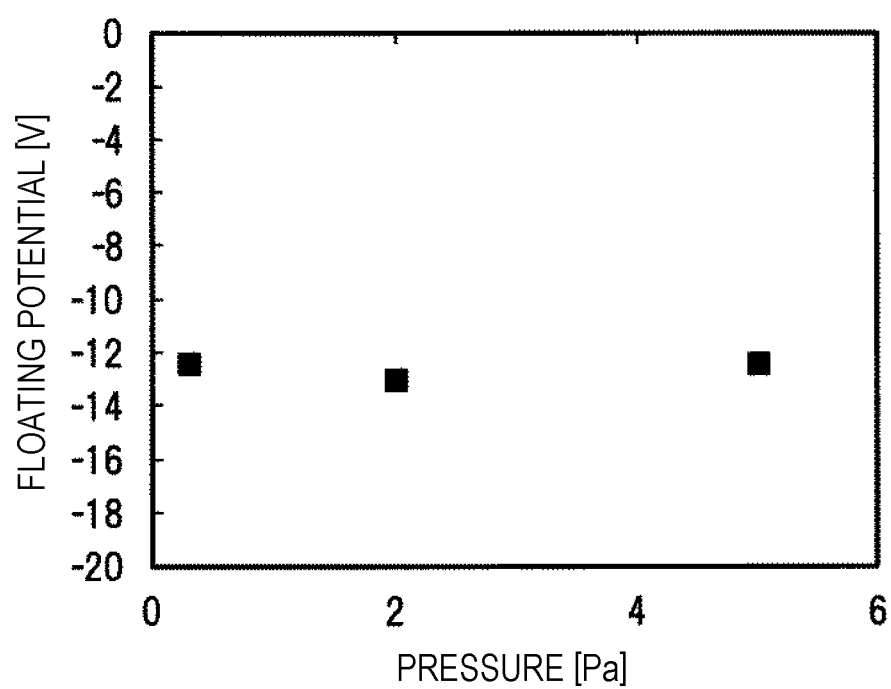

Next, the potential of the wafer during the neutralization plasma will be described. The potential of the wafer during the neutralization plasma is considered as equal to a floating potential during the neutralization plasma. FIGS. 5A and 5B illustrate results of measuring the floating potential of the plasma implemented by the inventor. FIG. 5A illustrates dependency of the microwave power with respect to the floating potential, and FIG. 5B illustrates dependency of pressure with respect to the floating potential. It can be seen from FIGS. 5A and 5B that the dependency of the floating potential with respect to the microwave power and the pressure at the time of the plasma processing are not large, and the variation of the floating potential with respect to the variation of the plasma processing conditions is relatively low. The floating potential is about −15 V on the average, and −15 V becomes a potential of the wafer to be corrected.

Regarding deviation in value, the absolute value of the floating potential falls within a range between −12 V to −18 V, so that it is considered appropriate that the margin is −15±5 V. For this reason, ΔV of FIGS. 3A to 3D in this embodiment is set to a value from −10 to −20 V.

Next, the description will be about a time t taken for the charged particles to disappear in the vacuum processing chamber after the microwave power for generating the plasma is turned off.

The time t taken for the charged particles to disappear is a time taken until the charged particles generated by the plasma completely disappear from the vacuum processing chamber after the microwave power for generating the plasma is turned off as described above. However, the disappearance of the charged particles from the vacuum processing chamber is likely to be affected not only from the state of the inside of the processing chamber such as a density of the charged particles in the plasma and a pressure in the vacuum processing chamber, but also from responsiveness of the microwave power source or the microwave oscillation source to a control signal and a deviation of response time thereof.

A sufficient time is necessarily secured for the time t taken for eliminating the charged particles in order to exclude such an influence. On the other hand, setting the time t taken for eliminating the charged particles to be long does not cause a problem from the viewpoint of neutralization. However, such an extra time taken from eliminating the charged particles may worsen a throughput, and thus not desirable. As a result of studying the time t taken for eliminating the charged particles in various conditions according to such an experiment of the inventor, 0.1 or more seconds are sufficient for eliminating the charged particles in the vacuum processing chamber. In addition, an upper limit of the time for eliminating the charged particles has been set to 3 seconds in a range not causing a problem in throughput. In addition, since the mechanism of waiting for the elimination of the charged particles is similar to that of the afterglow discharge after the microwave power is turned off, the time taken for ending the afterglow discharge may be set to a time in a range from 0.1 to 3 seconds.

Figure 6A:
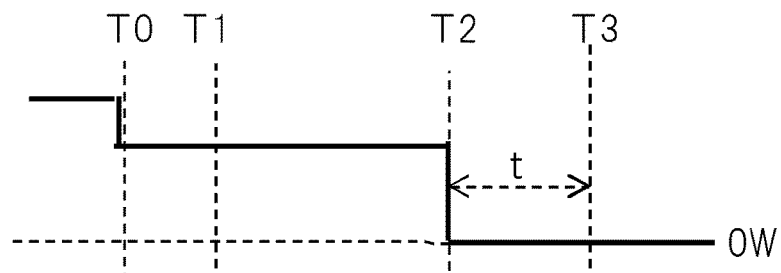
FIGS. 6A to 6E are a timing chart illustrating the neutralization processing according to the invention.
Figure 6B:
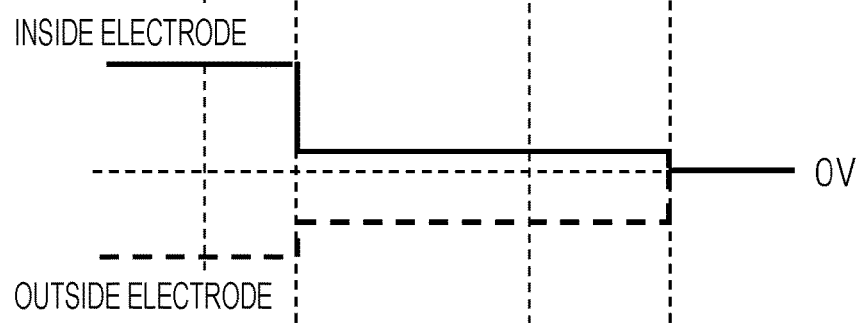
Figure 6C:
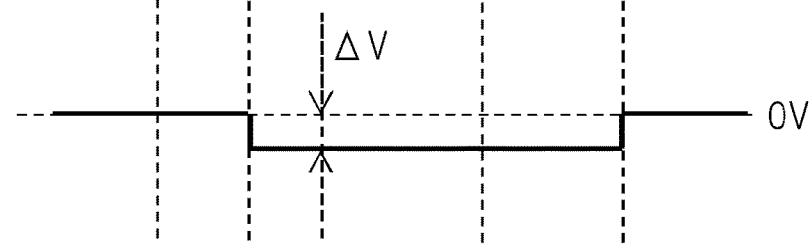
Figure 6D:
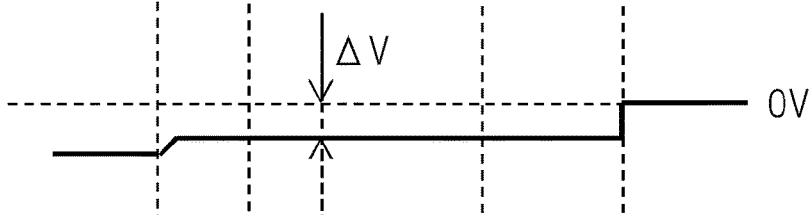
Figure 6E:
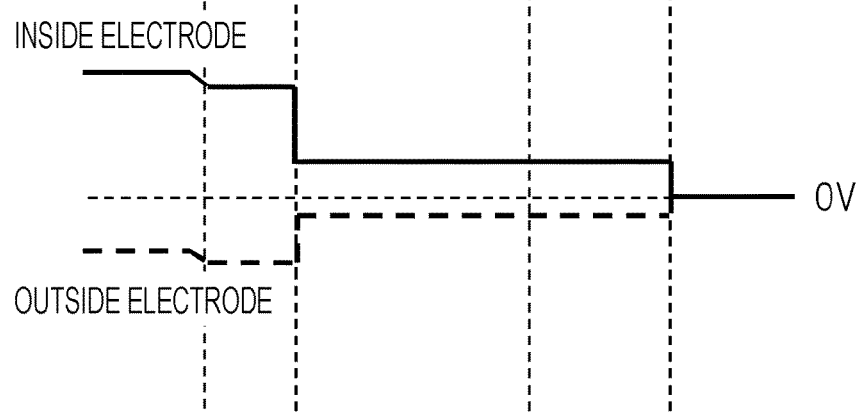

Next, an embodiment in which the inside electrostatic chuck electrode 108 and the outside electrostatic chuck electrode 109 are applied with different voltage at time T1 of FIGS. 3A to 3D will be described using a timing chart illustrated in FIGS. 6A to 6E focusing on configurations different from those of the embodiment of FIGS. 3A to 3D. FIG. 6A illustrates an incident power of the microwave, FIG. 6B illustrates potentials of the electrostatic chuck electrodes, FIG. 6C illustrates an average value of the potentials of the electrostatic chuck electrodes, FIG. 6D illustrates the potential of the wafer, and FIG. 6E illustrates a potential difference between the electrostatic chuck electrodes and the wafer. In addition, T0, T1, T2, T3, t, and ΔV in FIGS. 6A to 6E are used with the same symbols in FIGS. 3A to 3D and the same meaning.

In FIGS. 6A to 6E, the output voltage value of the variable DC power source 110 on the inside is set to Va at time T1 during a period when the neutralization plasma is being generated, and the output voltage value of the variable DC power source 111 on the outside is set to Vb. At this time, an average value of Va and Vb becomes a value (that is, −ΔV in FIGS. 3A to 3D) equal to the potential of the wafer as illustrated in FIG. 6C. Since the potential difference is caused as illustrated in FIG. 6E between the inside electrostatic chuck electrode and the wafer and between the outside electrostatic chuck electrode and the wafer at time T1, the adsorption force between the wafer and the electrostatic chuck electrode is not eliminated at this time.

Thereafter, the radio frequency power (microwave incident power) for generating the plasma is turned off at time T2. After the radio frequency power is turned off, the charged particles in the vacuum processing chamber completely disappear in the predetermined time t. Thereafter, the DC voltage applied to the inside electrostatic chuck electrode 108 and the outside electrostatic chuck electrode 109 becomes 0 V at time T3. When the DC voltage applied to the electrostatic chuck electrode becomes 0 V at time T3, an average value of the DC voltages applied to the inside electrostatic chuck electrode 108 and the outside electrostatic chuck electrode 109 varies only by $+\Delta V$ from $-\Delta V$ to 0 V as illustrated in FIG. 6C.

Since the variation in potential of the wafer is equal to the variation in average value of the DC voltages applied to the inside electrostatic chuck electrode 108 and the outside electrostatic chuck electrode 109 as expressed in Equation 3, the wafer potential comes to vary from $-\Delta V$ to 0 V at time T3 as illustrated in FIG. 6D. In other words, the potential of the inside electrostatic chuck electrode 108, the potential of the outside electrostatic chuck electrode 109, and the potential of the waver become 0 V at time T3, the potential difference between the wafer and the electrostatic chuck electrode is quickly released as illustrated in FIG. 6E, and the electrostatic adsorption force working between the wafer and the electrostatic chuck electrodes disappears.

The same effects as those of the method for releasing the wafer of FIGS. 3A to 3D can be obtained even by the method for releasing the wafer illustrated in FIGS. 6A to 6E, and the sample can be stably released from the sample stage without causing the residual adsorption force.

Hitherto, the description has been given on the basis of the embodiments of the invention, but the invention is not limited to these embodiments, and various changes may be made within a scope not departing from the spirit of the invention. For example, the voltage values of the DC power source which are applied to each of the inside electrostatic chuck electrode 108 and the outside electrostatic chuck electrode 109 are equal to each other in this embodiment, or different only in polarity. However, the voltage values of the DC power source which are applied to each of the inside electrostatic chuck electrode 108 and the outside electrostatic chuck electrode 109 may be any value as long as the average value of both voltages becomes $-\Delta V$. In other words, in a case where an average voltage of $-15$ V is applied as $-\Delta V$ from the variable DC power source to the electrostatic chuck electrode, the voltage to be applied to the inside electrostatic chuck electrode 108 may be set to $-5$ V, and the voltage to be applied to the outside electrostatic chuck electrode 109 is may be set to $-25$ V. In addition, in a case where an average voltage of $-15$ V is applied as $-\Delta V$ from the variable DC power source to the electrostatic chuck electrode, the voltage to be applied to the inside electrostatic chuck electrode 108 may be set to $+5$ V, and the voltage to be applied to the outside electrostatic chuck electrode 109 may be set to $-35$ V.

In addition, the control according to the invention as illustrated in FIGS. 3 and 6 is performed by the control unit 115. Further, this embodiment has been described using the dipole electrostatic chuck electrodes, and the invention may be applied to the monopole electrostatic chuck electrode.

In addition, $-\Delta V$ in this embodiment has been described as the same potential as the wafer potential (floating potential), and $-\Delta V$ may have a value that the wafer potential at time T3 of FIGS. 3 and 6 becomes almost "0". In a case where $-\Delta V$ is set to the floating potential due to disturbance such as noises, the wafer potential at time T3 may become a value not almost "0". In a case where $-\Delta V$ is set to a value that the wafer potential at time T3 becomes almost "0", there is an advantage that the wafer voltage at time T3 becomes almost "0" for sure.

Hitherto, in the invention, when the sample is released from the sample stage, an average value of the voltage to be applied to the electrostatic chuck electrodes is set to a predetermined negative potential according to the release of the sample adsorption during processing in consideration of residual charges after the plasma processing for releasing the sample ends, and the voltages to be applied to the electrostatic chuck electrodes are set to 0 V after the plasma processing for releasing the sample ends. Therefore, there is no concern about recharging after the plasma disappears. Since the potential of the wafer and the potential of the electrode both can be set to 0 V, the sample can be safely released from the sample stage without causing the residual adsorption force.

What is claimed is:

1. A plasma processing apparatus, comprising:
a processing chamber in which a sample is subjected to a plasma processing; a radio frequency power source which supplies radio frequency power to generate plasma;
a sample stage, which includes an electrode to electrostatically adsorb the sample, on which the sample is placed;
a DC (Direct Current) power source which applies a DC voltage to the electrode; and
a controller configured to:
change the radio frequency power from a first radio frequency power to a second radio frequency power after the plasma processing of the sample;
change the DC voltage from a value at the time of the plasma processing to a predetermined value while the second radio frequency power is supplied;
stop the supply of the second radio frequency power while the DC voltage is being applied to the electrode at the predetermined value;
change the DC voltage from the predetermined value to a value of 0V a predetermined amount of time after the supplying of the second radio frequency power is stopped; and
release the sample subjected to the plasma processing from the sample stage after the DC voltage is changed to the value of 0V,
wherein the second radio frequency power is a radio frequency power to generate plasma to release the sample electrostatically absorbed to the sample stage from the sample stage, and
wherein the predetermined value is a value defined such that a potential of the electrode corresponds to a potential of the sample when the DC voltage is changed to the predetermined value, and
wherein the predetermined time is a time when an afterglow discharge disappears after the supply of the second radio frequency power is stopped.

2. The plasma processing apparatus according to claim 1, wherein the electrode includes a first electrode and a second electrode,
wherein the DC power source includes a first DC power source which applies a first DC voltage to the first electrode and a second DC power source which applies a second DC voltage to the second electrode, and wherein the first DC voltage and the second DC voltage are defined such that an average value of the first DC voltage applied to the first electrode and the second DC voltage applied to the second electrode is applied to each of the first electrode and the second electrode as the predetermined value.

3. The plasma processing apparatus according to claim 1, wherein the predetermined value corresponds to a floating potential of the plasma generated by the second radio frequency power.

4. The plasma processing apparatus according to claim 1, wherein the predetermined value is set to a value from −10 to −20 V.

5. The plasma processing apparatus according to claim 1, wherein the predetermined amount time is a time from 0.1 to 3 seconds.

\* \* \* \* \*